United States Patent
Oredsson et al.

(10) Patent No.: US 10,826,432 B2
(45) Date of Patent: Nov. 3, 2020

(54) QUADRATURE OSCILLATOR

(71) Applicant: Telefonaktiebolaget LM Ericsson (publ), Stockholm (SE)

(72) Inventors: Filip Oredsson, Malmö (SE); Andreas Mårtensson, Staffanstorp (SE); Sven Mattisson, Lomma (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/473,287

(22) PCT Filed: Jan. 4, 2017

(86) PCT No.: PCT/EP2017/050117
§ 371 (c)(1),
(2) Date: Jun. 25, 2019

(87) PCT Pub. No.: WO2018/127277
PCT Pub. Date: Jul. 12, 2018

(65) Prior Publication Data
US 2019/0341886 A1    Nov. 7, 2019

(51) Int. Cl.
*H03B 27/00* (2006.01)
*H03B 5/12* (2006.01)
*H03L 7/099* (2006.01)

(52) U.S. Cl.
CPC ........... *H03B 27/00* (2013.01); *H03B 5/1215* (2013.01); *H03B 5/1228* (2013.01); *H03B 5/1243* (2013.01); *H03L 7/099* (2013.01); *H03B 2200/004* (2013.01); *H03B 2200/0078* (2013.01); *H03B 2202/05* (2013.01)

(58) Field of Classification Search
CPC ...................................................... H03B 27/00
USPC ............................................................ 331/48
See application file for complete search history.

(56) References Cited

U.S. PATENT DOCUMENTS

| 9,484,858 B1 * | 11/2016 | Kalia ................... H03B 5/1228 |
| 2004/0251975 A1 | 12/2004 | Li et al. |
| 2007/0077905 A1 | 4/2007 | Oh et al. |
| 2008/0079508 A1 * | 4/2008 | Byun ........................ H03B 5/06  331/167 |

(Continued)

OTHER PUBLICATIONS

Hsin, S., "Design and Analysis of Key Components for Manufacturable and Low-Power CMOS Millimeter-Wave Receiver Front End", Dissertation, Dec. 1, 2012, pp. 1-156, Georgia Institute of Technology, US.

(Continued)

*Primary Examiner* — Joseph Chang
(74) *Attorney, Agent, or Firm* — Coats & Bennett, PLLC

(57) ABSTRACT

An oscillator circuit (10) for generating quadrature-related first and second oscillation signals having equal frequencies comprises a first oscillation circuit (VCO_I) configured to generate the first oscillation signal having a first controllable frequency, a second oscillation circuit (VCO_Q) configured to generate the second oscillation signal having a second controllable frequency; and a controller (100) configured to enable and disable oscillation of the first and second oscillation circuits (VCO_I, VCO_Q) and to control the first and second controllable frequencies, such that when the oscillation is enabled, the first and second controllable frequencies are controlled to be initially unequal and then to become equal.

17 Claims, 6 Drawing Sheets

(56) References Cited

U.S. PATENT DOCUMENTS

2008/0143446 A1  6/2008  Yao et al.

OTHER PUBLICATIONS

Huang, D. et al., "A Frequency Synthesizer With Optimally Coupled QVCO and Harmonic-Rejection SSBmixer for Multi-Standard Wireless Receiver", IEEE Journal of Solid-State Circuits, vol. 46 No. 6, Jun. 1, 2011, pp. 1307-1320, IEEE.
Li, S. et al., "A 10-GHz CMOS Quadrature LC-VCO for Multirate Optical Applications", IEEE Journal of Solid-State Circuits, vol. 38 No. 10, Oct. 1, 2003, pp. 1626-1634, IEEE.
Tong, H. et al., "An LC Quadrature VCO Using Capacitive Source Degeneration Coupling to Eliminate Bi-Modal Oscillation", IEEE Transactions on Circuits and Systems—I: Regular Papers, vol. 59 No. 9, Sep. 1, 2012, pp. 1871-1879, IEEE.
Upadhyaya, P. et al., "A 1.1V Low Phase Noise CMOS Quadrature LC VCO with 4-Way Center-Tapped Inductor", 2007 IEEE/MTT-S International Microwave Symposium, Jun. 3, 2007, pp. 847-850, IEEE.
Shin, S. et al., "A Systematic Measurement Technique to Characterize Bimodal Oscillation for CMOS Quadrature LC-VCO", Proceedings of Asia-Pacific Microwave Conference 2010, Dec. 7, 2010, pp. 1051-1054, IEEE.

\* cited by examiner

|  | S1 | S2 | S3 | S4 |
|---|---|---|---|---|
| Mode 1 | CLOSED | OPEN | OPEN | CLOSED |
| Mode 2 | OPEN | CLOSED | CLOSED | OPEN |
FIG. 7
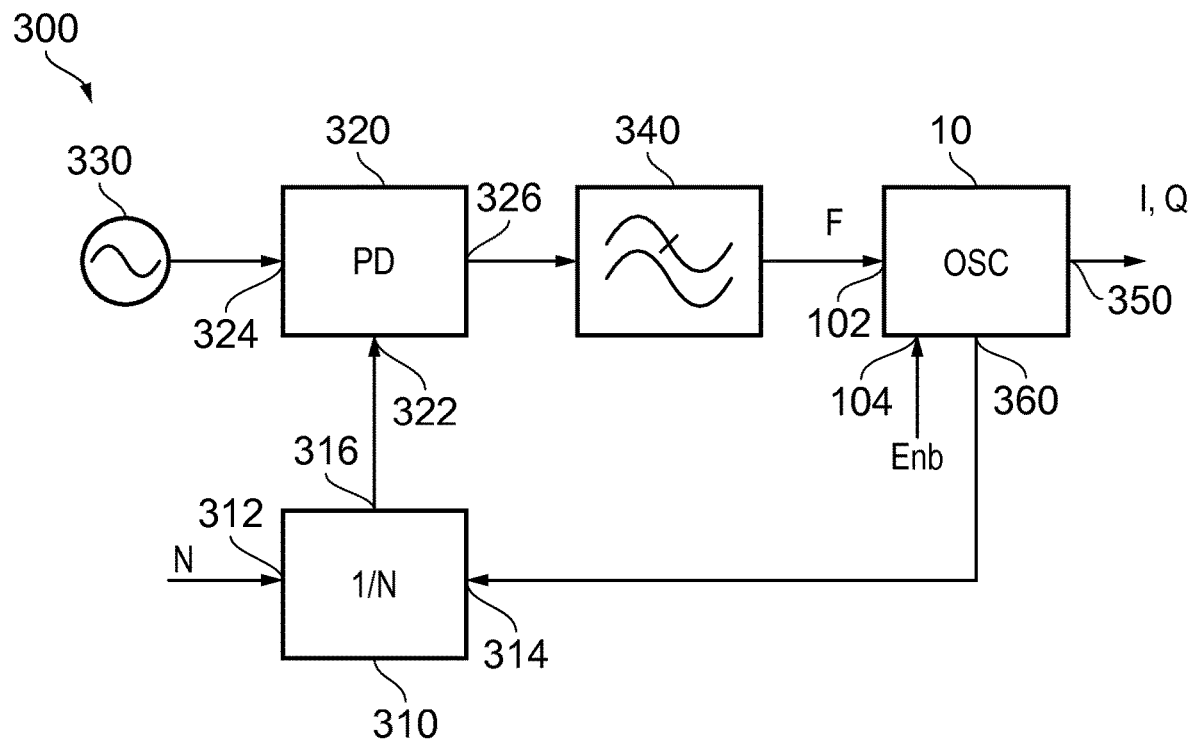
FIG. 8
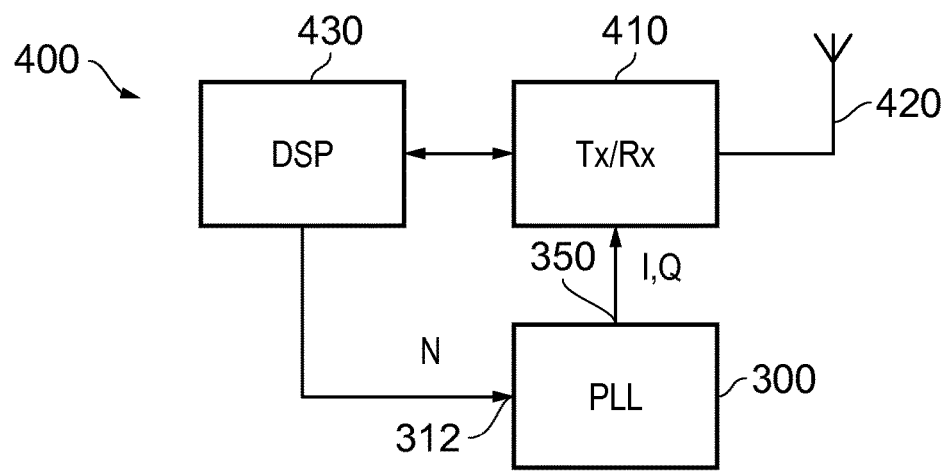
FIG. 9

QUADRATURE OSCILLATOR

FIELD OF THE DISCLOSURE

The present disclosure relates to an oscillator circuit, a phase locked loop comprising the oscillator circuit, a wireless communication device comprising the oscillator circuit, and a method of operating an oscillator circuit, and has application to, in particular, but not exclusively, apparatus for wireless communication.

BACKGROUND TO THE DISCLOSURE

In many communication systems today there is a need for generating quadrature signals, that is, signals having a 90-degree phase difference. For example, in a wireless transceiver using a zero intermediate frequency (IF) architecture, both the transmitter and receiver need such quadrature signals. However, the scope of this disclosure is not limited to transceivers but is applicable wherever quadrature signals are needed.

Shenggao Li et al, in "A 10-GHz CMOS Quadrature LC-VCO for Multirate Optical Applications", IEEE Journal Of Solid-State Circuits, Vol. 38, No. 10, October 2003, disclose a current-coupled voltage controlled oscillator that can be used to generate two differential signals in quadrature. It is explained how this kind of quadrature voltage controlled oscillator (QVCO) can have two stable oscillation modes. In steady state the phase difference between the quadrature signals can be either plus 90 degrees or minus 90 degrees. The uncertainty of the phase shift is problematic in practice. Furthermore, the resonant frequency is different in the two oscillation modes. To guarantee the QVCO locks into one of the modes, a solution disclosed by Shenggao Li et al is the use of a phase shift in the coupling between two oscillator cores, in order to make one of the modes more dominant and enable the QVCO to operate in a fixed mode in a stable manner.

Haitao Tong et al, in "An LC Quadrature VCO Using Capacitive Source Degeneration Coupling to Eliminate Bi-Modal Oscillation", IEEE Transactions On Circuits And Systems—I: Regular Papers, Vol. 59, No. 9, September 2012, disclose the use of capacitive source degeneration to introduce a phase shift for the coupling between the oscillator cores.

Schemes that are based on the concept of introducing a phase shift in the coupling between the oscillator cores entail adding extra circuitry to a conventional QVCO, or more extensive modifications. These modifications will affect the performance of the QVCO, for example degrading the phase noise. Moreover, the scheme disclosed by Haitao Tong et al is difficult to implement at high frequencies, for example above 30 GHz.

Shih-Chieh Hsin, in "Design and Analysis of Key Components for Manufacturable and Low-Power CMOS Millimeter-Wave Receiver Front End", Georgia Institute of Technology, December, 2012, discloses starting a QVCO with a tuning voltage of either 1V or 0V to get the oscillation started in either state, then gradually decreasing or increasing the voltage to a desired level. However, it has been found that, in some implementations, the QVCO always starts in the same mode for all levels of the tuning voltage between a positive supply and ground.

There is a requirement for improvements in quadrature oscillators.

SUMMARY OF THE PREFERRED EMBODIMENTS

According to a first aspect there is provided an oscillator circuit for generating quadrature-related first and second oscillation signals having equal frequencies, the oscillator circuit comprising: a first oscillation circuit configured to generate the first oscillation signal having a first controllable frequency; a second oscillation circuit configured to generate the second oscillation signal having a second controllable frequency; and a controller configured to enable and disable oscillation of the first and second oscillation circuits and to control the first and second controllable frequencies, such that when the oscillation is enabled, the first and second controllable frequencies are controlled to be initially unequal and then to become equal.

According to a second aspect there is provided a method of operating an oscillator circuit to generate quadrature-related first and second signals having equal frequencies, the oscillator circuit comprising: a first oscillation circuit configured to generate the first oscillation signal having a first controllable frequency; and a second oscillation circuit configured to generate the second oscillation signal having a second controllable frequency; the method comprising enabling oscillation of the first and second oscillation circuits and controlling the first and second controllable frequencies to be initially unequal and then to become equal.

Controlling the first and second controllable frequencies to be initially unequal provides improved reliability, by forcing the oscillator circuit to oscillate in one of the two possible oscillation modes. Controlling the first and second controllable frequencies to become equal enables the frequency of oscillation of the oscillator circuit to be tuned to a desired value, after oscillation has commenced.

The controller may be configured to select which of the first and second controllable frequencies has a higher of the unequal frequencies. Likewise, the method may comprise selecting which of the first and second controllable frequencies has a higher of the unequal values. This feature enables the mode of oscillation to be selected, such that the phase difference between the first and second oscillation signals is either plus 90 degrees or minus 90 degrees. Therefore, the first oscillation signal may lead the second oscillation signal by 90 degrees, or the second oscillation signal may lead the first oscillation signal by 90 degrees. Moreover, as the resonant frequency is different in the two oscillation modes, this feature enables the tuning range of the oscillator circuit to be increased by an amount equal to this difference.

The unequal frequencies may differ by at least one percent, at least five percent, at least ten percent, or at least twenty percent, of the lower of the unequal frequencies, depending on the circuitry employed, the frequency of operation, and the required reliability of the mode. This feature enables improved reliability in establishing the mode of oscillation.

The equal frequencies may differ from both of the unequal frequencies. This feature enables high reliability in establishing the mode of oscillation, and flexibility in selecting the frequency of oscillation, as both of the unequal frequencies may be selected for high reliability of mode selection, and neither of the unequal frequencies is constrained to be equal to the equal frequencies.

The controller may be configured to smooth the transition of the first and second controllable frequencies from their respective unequal frequencies to their equal frequencies. Likewise, the method may comprise smoothing the transition of the first and second controllable frequencies from their respective unequal frequencies to their equal frequencies. This feature enables improved spectral purity of the first and second oscillation signals.

The first oscillation circuit may comprise a first resonant circuit having a first resonant frequency dependent on a first tuning signal, the second oscillation circuit may comprise a second resonant circuit having a second resonant frequency dependent on a second tuning signal, and the controller may be configured to control the first and second controllable frequencies to be initially unequal by establishing the first and second tuning signals at unequal values prior to enabling oscillation of the first and second oscillation circuits. This feature enables a low complexity implementation.

The first resonant circuit may comprise a first capacitive device having a capacitance dependent on the first tuning signal, and the second resonant circuit may comprise a second capacitive device having a capacitance dependent on the second tuning signal. This feature enables a low complexity implementation.

The first and second capacitive devices may each comprise a varactor. This feature enables a low complexity implementation.

The first and second tuning signals may be variable over a voltage range and the unequal values may differ by at least ten percent of the voltage range. This feature enables improved reliability in establishing the mode of oscillation.

One of the unequal values may be at a ground potential. This feature enables a low complexity implementation as, for example, readily available voltage rails may be used to provide the unequal values.

The controller may comprise a filter configured to smooth the transition of the first and second tuning signals, or the tuning voltages, from their respective unequal values to subsequent equal values for establishing the equal frequencies. This feature enables improved spectral purity of the first and second oscillation signals.

There is also provided a phase locked loop comprising an oscillator circuit according to the first aspect.

There is also provided a wireless communication device comprising an oscillator circuit according to the first aspect.

Preferred embodiments are described, by way of example only, with reference to the accompanying drawings.

BRIEF DESCRIPTION OF THE DRAWINGS

FIG. 7 is a table illustrating switch settings for different oscillation modes.
FIG. 8 is a block diagram of a phase locked loop comprising an oscillator circuit.
FIG. 9 is a block diagram of a wireless communication device comprising an oscillator circuit.

DETAILED DESCRIPTION OF PREFERRED EMBODIMENTS

Figure 1:
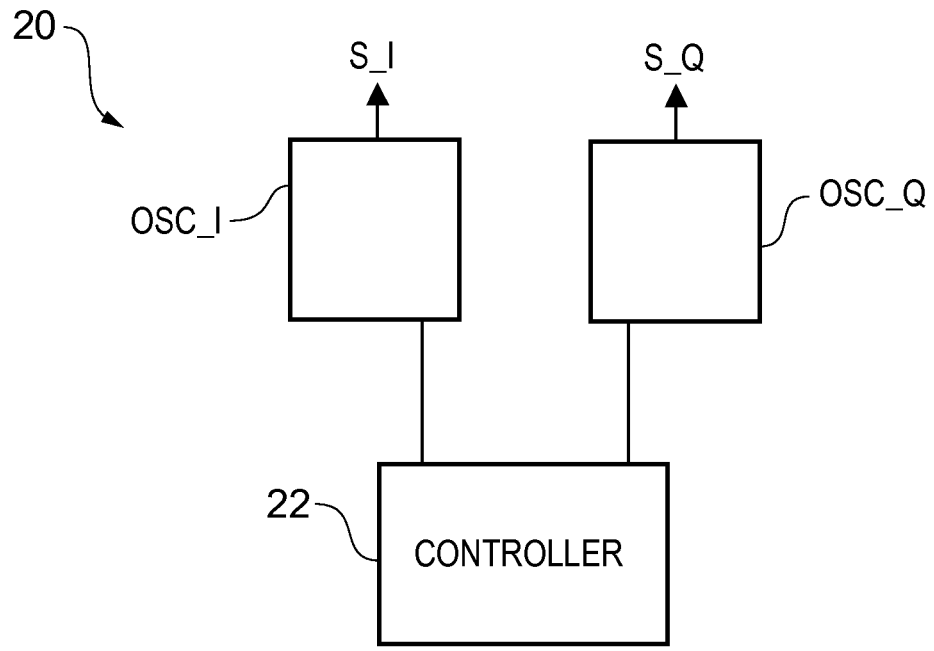
FIG. 1 is a diagram of an oscillator circuit.

Referring to FIG. 1, there is illustrated an oscillator circuit 20 for generating quadrature-related first and second oscillation signals S_I, S_Q. The oscillator circuit 20 comprises a first oscillation circuit OSC_I that generates the first oscillation signal S_I having a first controllable frequency, and a second oscillation circuit OSC_Q that generates the second oscillation signal S_Q having a second controllable frequency. In some embodiments, the first and second oscillation circuits OSC_I, OSC_Q may be coupled. The oscillator circuit 20 also comprises a controller 22 coupled to the first and second oscillation circuits OSC_I, OSC_Q for enabling and disabling oscillation of the first and second oscillation circuits OSC_I, OSC_Q and for controlling the first and second controllable frequencies.

Figure 2:
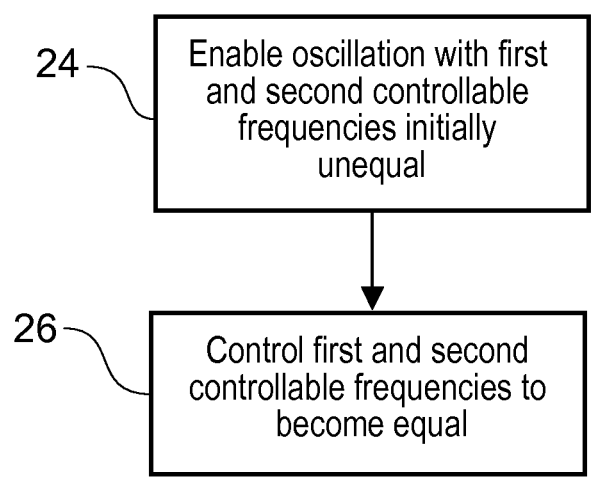
FIG. 2 is a flow chart illustrating a method of operating an oscillator.

The operation of the oscillator circuit 20 is described with reference to the flow chart of FIG. 2. Assuming an initial state in which the first and second oscillation circuits OSC_I, OSC_Q are disabled from oscillating, at step 24, under the control of the controller 22, oscillation of the first and second oscillation circuits OSC_I, OSC_Q is enabled and the first and second controllable frequencies are controlled to be initially, that is, from commencement of the oscillation, unequal. At step 26, under the control of the controller 22, the first and second controllable frequencies are controlled to become equal. Either of the unequal first and second controllable frequencies may be selected to have a higher frequency than the other, depending on whether the first or second oscillation signal S_I, S_Q is required to lead by ninety degrees, that is, which mode of oscillation is required. The unequal first and second controllable frequencies may differ by, for example, at least one percent, at least five percent, or at least ten percent, relative to the lower of the unequal frequencies, with the greater differences enabling higher reliability of selecting the desired mode of oscillation. The time between steps 24 and 26, that is, between the commencement of the oscillation and the first and second controllable frequencies becoming equal, can be chosen to suit the circuitry employed and the desired frequency of oscillation of the oscillator circuit 20. The controller 22 may be configured to smooth the transition of the first and second controllable frequencies from their respective unequal frequencies to their equal frequencies. When the frequencies become equal, the quadrature relationship between the first and second oscillation signals is established.

The first and second oscillation circuits OSC_I, OSC_Q may be arranged to have, respectively, the first and second controllable frequencies by comprising tunable resonant circuits which may be tuned by respective first and second tuning signals under the control of the controller 22. For example, such a tunable resonant circuit may comprise an inductive device comprising a switchable bank of inductive elements which is switched, under the control of the controller 22, over a range of inductance by the tuning signal, and where the tuning signal is, for example, a digital signal comprising a digital word. In this case, in order to provide the unequal frequencies of the first and second controllable frequencies, the tunable resonant circuits of the first and second oscillation circuits OSC_I, OSC_Q may be controlled to have a difference in inductance that is, for example, at least ten percent of the range of inductance.

As another example, such a tunable resonant circuit may comprise a capacitive device comprising a switchable bank of capacitive elements which is switched, under the control of the controller 22, over a capacitance range by the tuning signal, and where the tuning signal is, for example, a digital signal comprising a digital word. In this case, in order to provide the unequal frequencies of the first and second controllable frequencies, the tunable resonant circuits of the first and second oscillation circuits OSC_I, OSC_Q may be controlled to have a difference in capacitance that is, for example, at least ten percent of the capacitance range.

In other embodiments, such a tunable resonant circuit may comprise a voltage controlled capacitive device, such as a varactor, or a voltage controlled inductive device, and the tuning signal may be a voltage that is variable over a voltage range. In this case, in order to provide the unequal frequencies of the first and second controllable frequencies, the voltage controlled devices of the tunable resonant circuits of the first and second oscillation circuits OSC_I, OSC_Q may be controlled with tuning signals that differ by, for example, at least ten percent of the voltage range.

Figure 3:
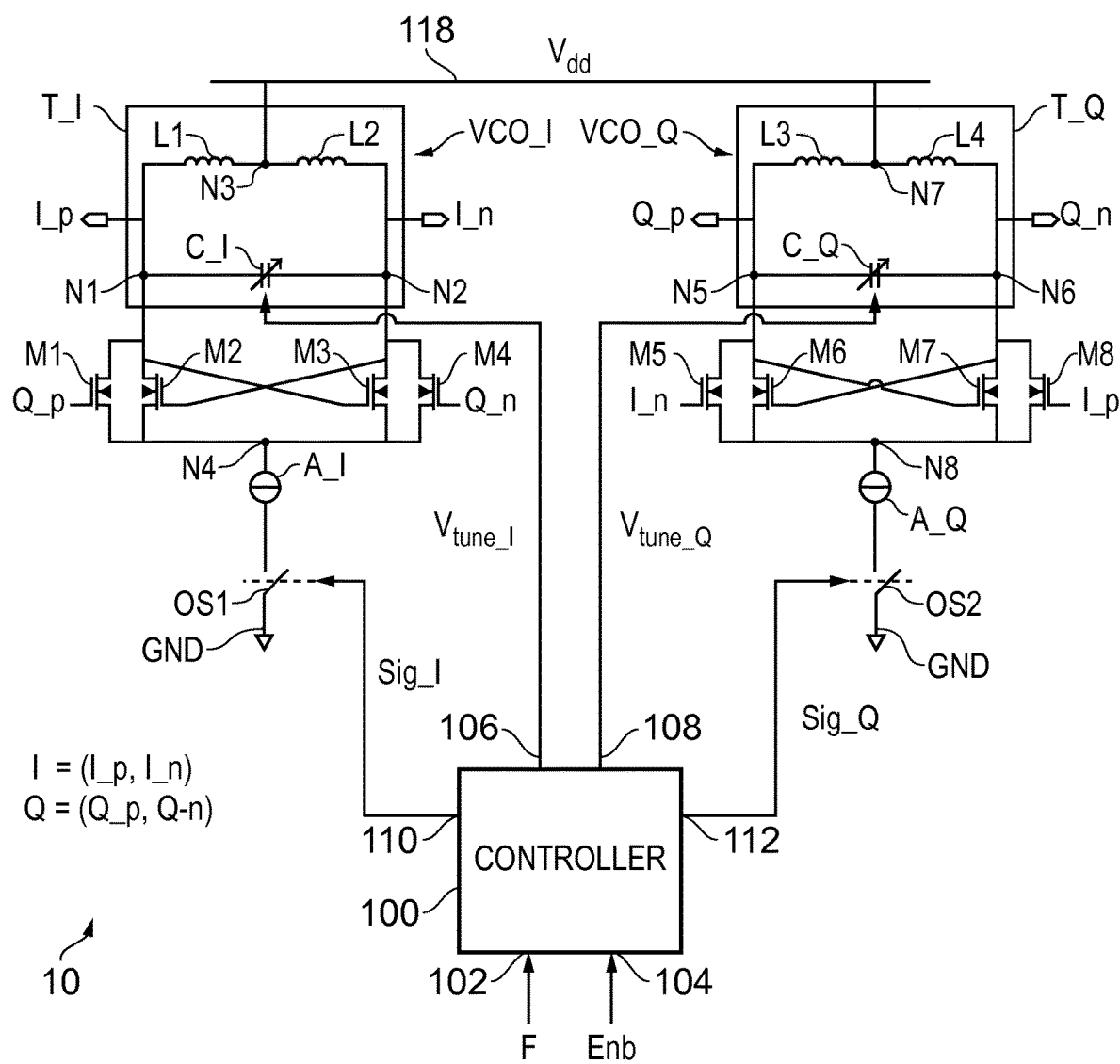
FIG. 3 is a diagram of an oscillator circuit.

Referring to FIG. 3, there is illustrated a further embodiment of an oscillator circuit 10 for generating quadrature-related first and second oscillation signals. The oscillator circuit 10 comprises a first oscillation circuit VCO_I that generates the first oscillation signal, and a second oscillation circuit VCO_Q that generates the second oscillation signal. The first oscillation signal is referred to in this description as an in-phase signal and is denoted I. This in-phase signal I is a balanced signal comprising positive and negative first signal components denoted I_p and I_n that are the inverse of each other, that is, they have a phase difference of 180 degrees. The second oscillation signal is referred to in this description as a quadrature-phase signal and is denoted Q. This quadrature-phase signal Q is a balanced signal comprising positive and negative second signal components denoted Q_p and Q_n that are the inverse of each other, that is, they have a phase difference of 180 degrees. When the frequencies of the first and second oscillation signals I, Q become equal, the quadrature relationship between the first and second oscillation signals I, Q is established and so the first and second oscillation signals I, Q have a phase difference of 90 degrees. Therefore, there is a 90-degree phase difference between the positive first and second signal components I_p, Q_p, and a 90-degree phase difference between the negative first and second signal components I_n, Q_n. In one oscillation mode the first oscillation signal I leads the second oscillation signal Q by 90 degrees, and in the other oscillation mode the second oscillation signal Q leads the first oscillation signal I by 90 degrees.

The first oscillation circuit VCO_I comprises a first resonant circuit T_I comprising a first capacitive device C_I coupled between a first node N1 and a second node N2 and having a capacitance dependent on a first tuning voltage Vtune_I. The first resonant circuit T_I also comprises a first inductive element L1 coupled between the first node N1 and a third node N3, and a second inductive element L2 coupled between the third node N3 and the second node N2. Therefore, the first and second inductive elements L1, L2 are coupled in series between the first node N1 and the second node N2. The first and second inductive elements L1, L2 may be implemented as distinct inductors, or may be implemented as portions of a single centre-tap inductor, with the third node N3 corresponding to the centre-tap. The third node N3 is coupled to a power supply rail 118 at a voltage Vdd.

The first oscillation circuit VCO_I also comprises first and second transistors M1, M2 each having a channel coupled between the first node N1 and a fourth node N4, and third and fourth transistors M3, M4 each having a channel coupled between the second node N2 and the fourth node N4. A gate of the second transistor M2 is coupled to the second node N2, and a gate of the third transistor M3 is coupled to the first node N1. The positive first signal component I_p is generated at the first node N1, and the negative first signal component I_n is generated at the second node N2. A first current source A_I and a first oscillation control switch OS1 are coupled in series between the fourth node N4 and a ground GND.

The second oscillation circuit VCO_Q comprises a second resonant circuit T_Q comprising a second capacitive device C_Q coupled between a fifth node N5 and a sixth node N6 and having a capacitance dependent on a second tuning voltage Vtune_Q. The second resonant circuit T_Q also comprises a third inductive element L3 coupled between the fifth node N5 and a seventh node N7, and a fourth inductive element L4 coupled between the seventh node N7 and the sixth node N6. Therefore, the third and fourth inductive elements L3, L4 are coupled in series between the fifth node N5 and the sixth node N6. The third and fourth inductive elements L3, L4 may be implemented as distinct inductors, or may be implemented as portions of a single centre-tap inductor, with the seventh node N7 corresponding to the centre-tap. The seventh node N7 is coupled to the power supply rail 118 at the voltage Vdd.

The second oscillation circuit VCO_Q also comprises fifth and sixth transistors M5, M6 each having a channel coupled between the fifth node N5 and an eighth node N8, and seventh and eighth transistors M7, M8 each having a channel coupled between the sixth node N2 and the eighth node N8. A gate of the sixth transistor M6 is coupled to the sixth node N6, and a gate of the seventh transistor M7 is coupled to the fifth node N5. The positive second signal component Q_p is generated at the fifth node N5, and the negative fifth signal component Q_n is generated at the sixth node N6. A second current source A_Q and a second oscillation control switch OS2 are coupled in series between the eighth node N8 and the ground GND.

A gate of the first transistor M1 is coupled to the fifth node N5. A gate of the fourth transistor M4 is coupled to the sixth node N6. A gate of the fifth transistor M5 is coupled to the second node N2. A gate of the eighth transistor M8 is coupled to the first node N1. In this way, the first and second oscillation circuits VCO_I, VCO_Q are coupled together.

The oscillator circuit 10 further comprises a controller 100 that has a first controller input 102 for receiving a frequency control signal F indicative of a required frequency of oscillation of the oscillator circuit 10, and a second controller input 104 for receiving an oscillator enable signal Enb indicative of whether the oscillator circuit 10 is required to be enabled or disabled from generating the quadrature-related first and second oscillation signals I, Q. The controller 100 has a first controller output 106 for delivering the first tuning voltage Vtune_I, and a second controller output 108 for delivering the second tuning voltage Vtune_Q. The first controller output 106 is coupled to a control terminal of the first capacitive device C_I for controlling the capacitance of the first capacitive device C_I in response to the first tuning voltage Vtune_I, thereby enabling fine tuning of the first oscillation signal I. The second controller output 108 is coupled to a control terminal of the second capacitive device C_Q for controlling the capacitance of the second capacitive device C_Q in response to the second tuning voltage Vtune_Q, thereby enabling fine tuning of the second oscillation signal Q. Therefore, the first and second oscillation signals I,Q have, respectively, first and second controllable frequencies, and likewise the positive and negative first and second signal components I_p, I_n, Q_p, Q_n have, respectively, first and second controllable frequencies.

The controller 100 has a third controller output 110 for delivering a first oscillation control signal Sig_I. The third controller output 110 is coupled to a control terminal of the first oscillation control switch OS1 for controlling the first oscillation control switch OS1 in response to the first oscillation control signal Sig_I. The controller 100 has a fourth controller output 112 for delivering a second oscillation control signal Sig_Q. The fourth controller output 112 is coupled to a control terminal of the second oscillation control switch OS2 for controlling the second oscillation control switch OS1 in response to the second oscillation control signal Sig_Q.

Figure 4:
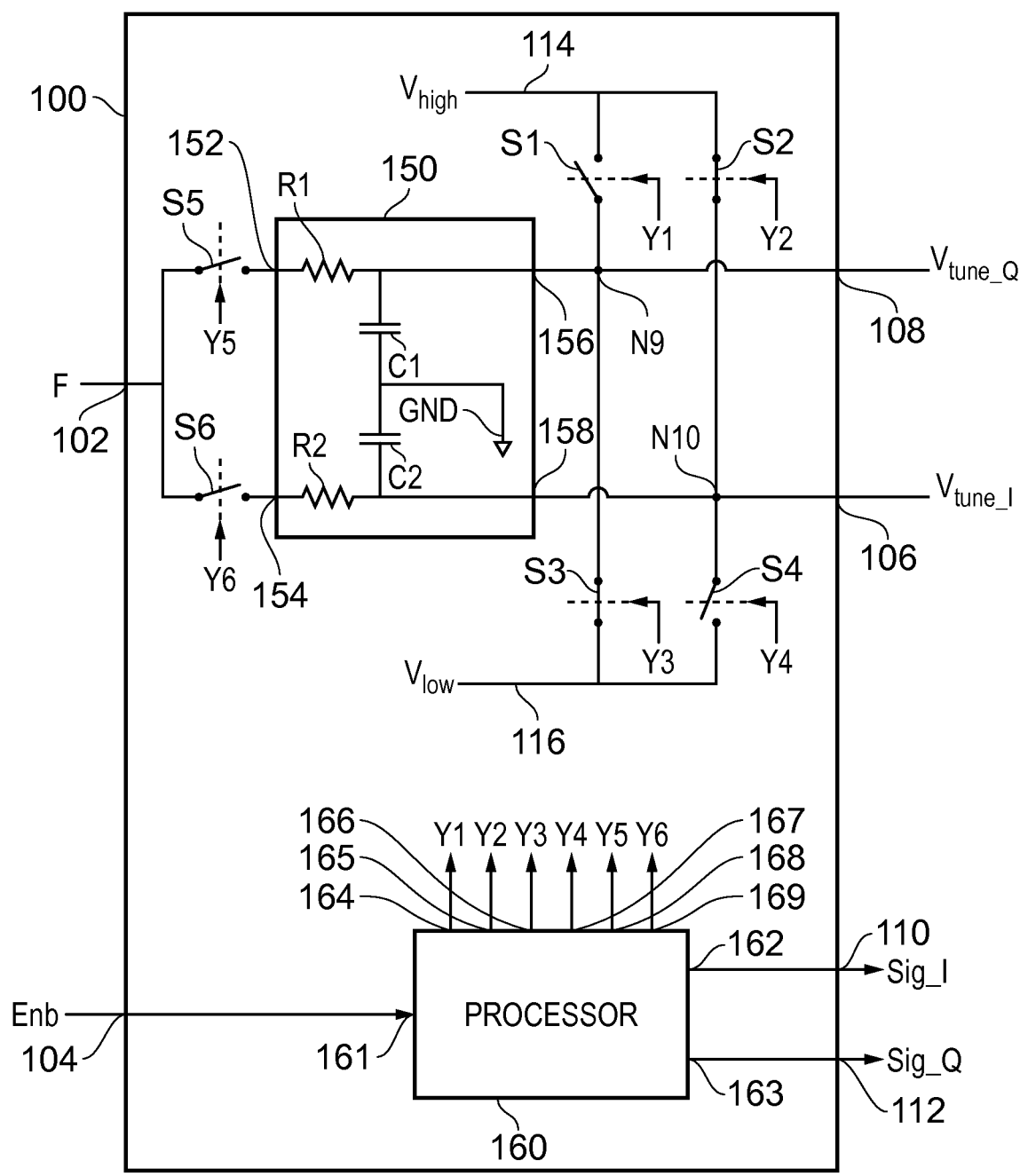
FIG. 4 is a diagram of a controller.

Referring to FIG. 4, the controller 100 comprises a first switch S1 coupled between an upper voltage rail 114 at a voltage Vhigh and a ninth node N9, a second switch S2 coupled between the upper voltage rail 114 and a tenth node N10, a third switch S3 coupled between a lower voltage rail 116 at a voltage Vlow and the ninth node N9, and a fourth switch S4 coupled between the lower voltage rail 116 and the tenth node N10. The voltage Vlow is lower than Vhigh. For example, Vlow may be 0V and Vhigh may be 1V, providing a difference of 1V between the upper voltage rail 114 and the lower voltage rail 116. The difference may instead be smaller or larger than 1V.

The controller 100 further comprises a fifth switch S5 coupled between the first controller input 102, for receiving the frequency control signal F, and a first filter input 152 of the filter 150, and a sixth switch S6 coupled between the first controller input 102, also for receiving the frequency control signal F, and a second filter input 154 of the filter 150. A first filter output 156 of the filter 150 is coupled to the ninth node N9, and a second filter output 158 of the filter 150 is coupled to the tenth node N10. The tenth node N10 is coupled to the first controller output 106 for delivering the first tuning voltage Vtune_I, and the ninth node N9 is coupled to the second controller output 108 for delivering the second tuning voltage Vtune_Q.

The first switch S1 is controllable by a first switch control signal Y1, such that the first switch S1 may be either closed or open, that is, in a conducting state or in a non-conducting state. Likewise, the second, third, fourth, fifth and sixth switches S2, S3, S4, S5, S6 are controllable by, respectively, second, third, fourth, fifth and sixth switch control signals Y2, Y3, Y4, Y5, Y6 such that the second, third, fourth, fifth and sixth switches S2, S3, S4, S5, S6 may be either closed or open, that is, in a conducting state or in a non-conducting state. The first, second, third, fourth, fifth and sixth switch control signals Y1, Y2, Y3, Y4, Y5, Y6 are provided by a processor 160 described below.

The processor 160 has a processor input 161 coupled to the second controller input 104 for receiving the oscillator enable signal Enb, a first processor output 162 coupled to the third controller output 110 for delivering the first oscillation control signal Sig_I, and a second processor output 163 coupled to the fourth controller output 112 for delivering the second oscillation control signal Sig_Q. The processor also has third, fourth, fifth, sixth, seventh and eighth processor outputs 164, 165, 166, 167, 168, 169 coupled to respective control inputs of the first, second, third, fourth, fifth and sixth switches S1, S2, S3, S4, S5, S6 for delivering the respective first, second, third, fourth, fifth and sixth switch control signals Y1, Y2, Y3, Y4, Y5, Y6.

The filter 150 comprises a first resistive element R1 coupled between the first filter input 152 and the first filter output 156, and a second resistive element R2 coupled between the second filter input 154 and the second filter output 158. The filter 150 also comprises a first capacitive element C1 coupled between the first filter output 156 and ground GND, and a second capacitive element C2 coupled between the second filter output 158 and ground GND.

The operation of the oscillator circuit 10 is described below with reference to the flow chart of FIG. 5, the timing diagram of FIG. 6, and the Table of FIG. 7. The steps for switching on the oscillator circuit 10 in the first mode will be described firstly, and then the differences required for switching on the oscillator circuit 10 in the second mode will be described. For clarity, it is assumed that the voltage Vlow of the lower voltage rail 116 is 0V, although this is not essential. The times illustrated in FIG. 6 are not to scale and are not intended to convey numerical values, but are intended to illustrate the order of events.

In the initial state, the first and second oscillation control switches OS1, OS2 are open in response to the first and second oscillation control signals Sig_I, Sig_Q which are controlled by the controller 100, or more specifically, by the processor 160. Therefore, current cannot flow through the first and second oscillation circuits VCO_I, VCO_Q, and so the oscillator circuit 10 is not oscillating, and is therefore disabled. Also, in the initial state, the first, second, third, fourth, fifth and sixth switches S1, S2, S3, S4, S5, S6 are open, that is, non-conducting, in response to the first, second, third, fourth, fifth and sixth switch control signals Y1, Y2, Y3, Y4, Y5, Y6 respectively, which are controlled by the processor 160. Therefore, the first and second tuning voltage Vtune_I, Vtune_Q are floating, and in FIG. 6 have been illustrated as 0V. However, as the oscillator circuit 10 is disabled from oscillating, the initial voltages of the first and second tuning voltages Vtune_I, Vtune_Q may have any value, for example, 0V by commencing with the third and fourth switches S3, S4 closed. Likewise, as the oscillator circuit 10 is disabled from oscillating, the frequency control signal F may have any initial value.

Figure 5:
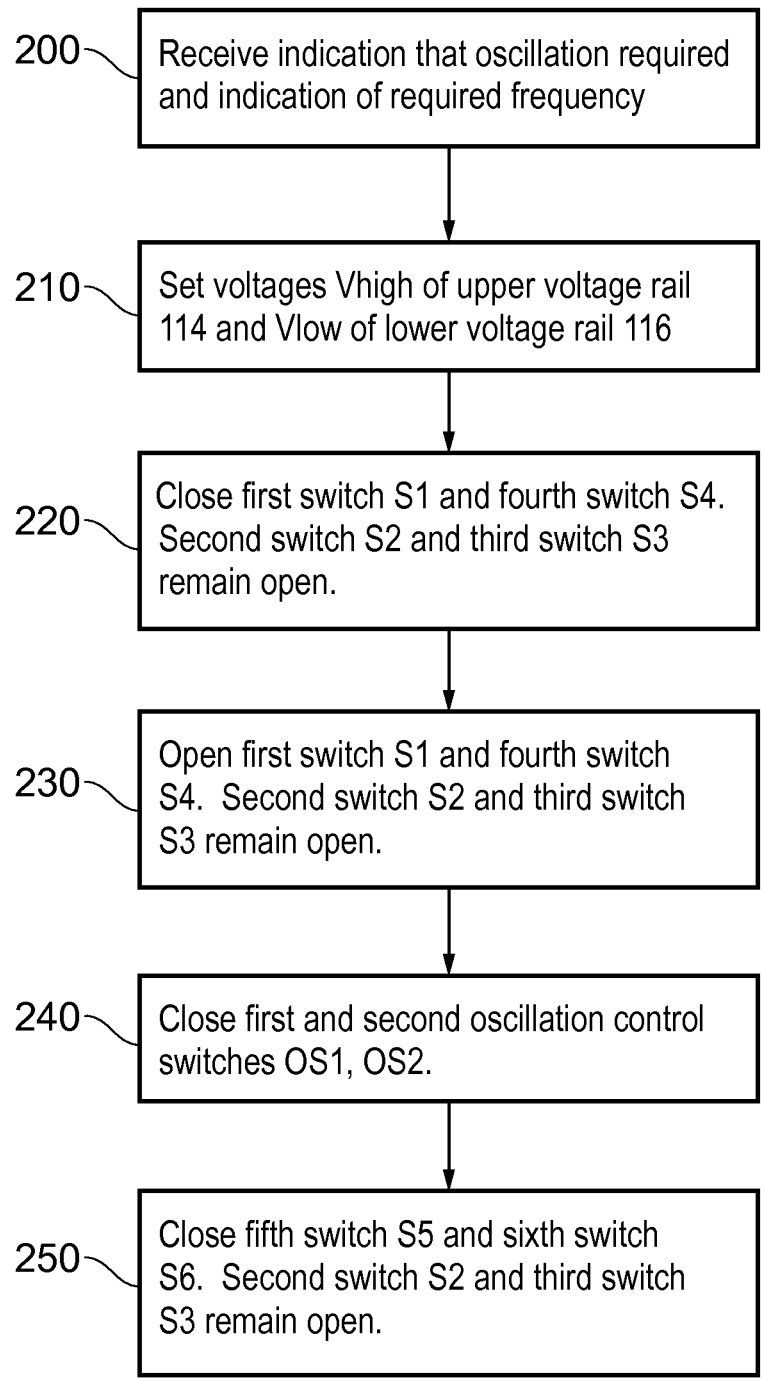
FIG. 5 is a flow chart illustrating a method of operating an oscillator.
Figure 6:
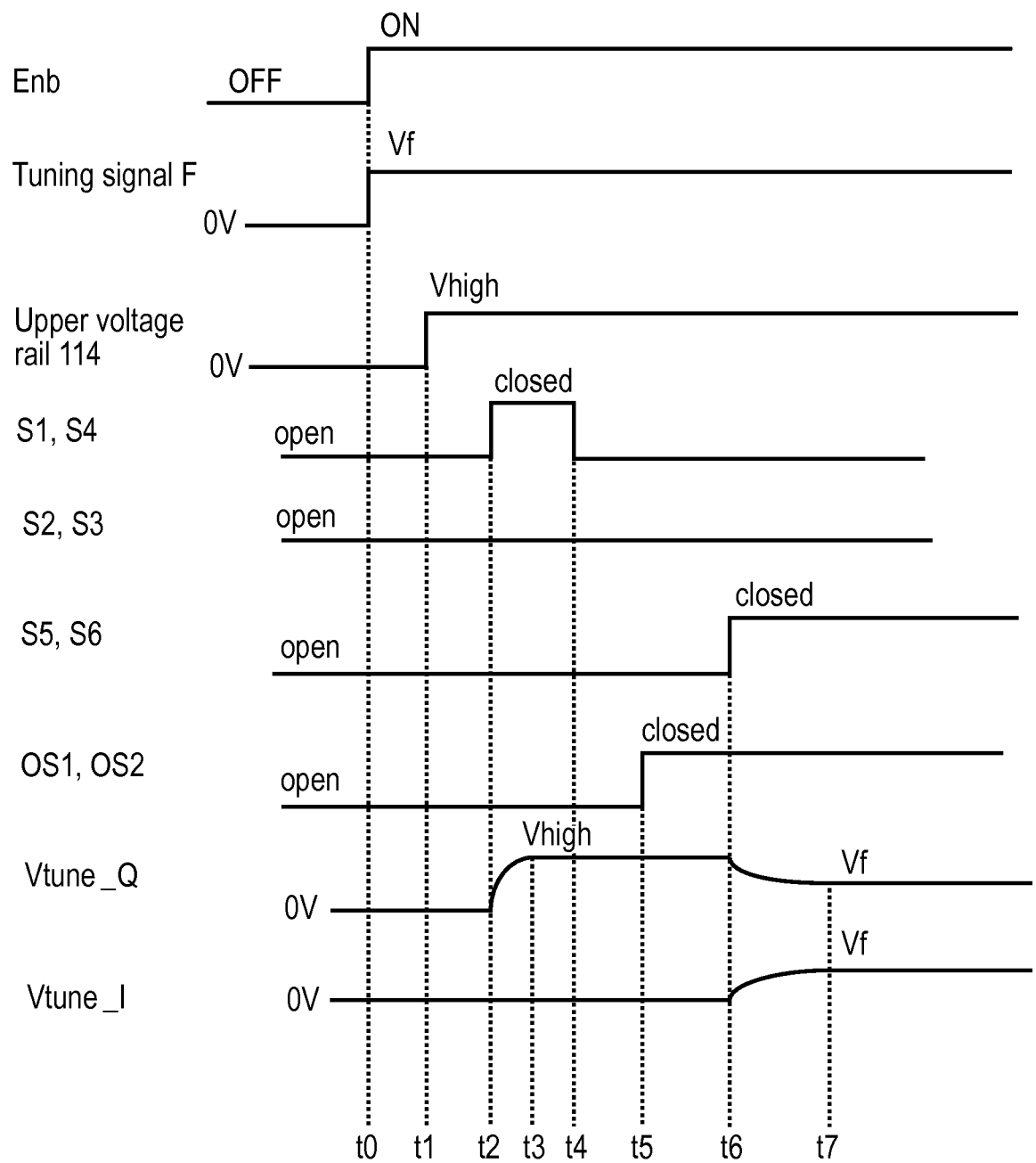
FIG. 6 is a timing diagram.

Referring to FIG. 5, at step 200, and time t0 in FIG. 6, the enable signal Enb indicates that the oscillator circuit 10 is required to be switched on, that is, enabled, to generate the quadrature-related first and second oscillation signals I, Q. Also at step 200 and time t0, the frequency control signal F switches to a voltage Vf indicative of a required frequency of oscillation of the oscillator circuit 10. The frequency control signal F may be provided by, for example, a loop filter in a phase locked loop.

At step 210 and time t1, in response to the enable signal Enb, the upper voltage rail 114 is set to the voltage Vhigh, under the control of the processor 160. Likewise, under the control of the processor 160, the lower voltage rail 116 may also be set to voltage Vlow, if that is different from its initial state of 0V. In other embodiments, the voltages of the upper and lower voltage rails 114, 116 may be controlled externally to the oscillator circuit 10. Alternatively in other embodiments, the upper and lower voltage rails 114, 116 may already be at respective voltages Vhigh and Vlow prior to t1, in which case they do not need to be switched at time t1.

At step 220 and time t2, the first and fourth switches S1, S4 are closed, whilst the second and third switches S2, S3 remain open. Consequently, the second tuning voltage Vtune_Q at the ninth node N9 and at the second controller output 108 increases from 0V, becoming equal to, or substantially equal to, the voltage Vhigh at time t3. This increase is gradual due to the need for the first capacitive element C1 to be charged through the first switch S1. Similarly, if the voltage Vlow of the lower voltage rail 116 V is not 0V, the first tuning voltage Vtune-I at the tenth node N10 and at first controller output 106 would gradually become equal to Vlow during the period t2 to t3, with the second capacitive element C2 charging through the fourth switch S4.

At step 230 and time t4, the first and fourth switches S1, S4 are opened, whilst the second and third switches S2, S3 remain open. Therefore, the first and second controller outputs 106, 108 are decoupled from the upper and lower voltage rail 114, 116, and the first and second tuning voltages Vtune_I, Vtune_Q remain at Vlow and Vhigh respectively due to the charge on the first and second capacitive elements C1, C2. In this way, the upper and lower voltage rails 114, 116 are decoupled from the first and second oscillation circuits VCO_I, VCO_Q, thereby avoiding degradation of phase noise of the oscillator circuit 10.

At step 240 and time t5, the first and second oscillation control switches OS1, OS2 are closed, thereby enabling the first and second oscillation circuits VCO-I, VCO_Q to commence oscillating, with the first and second tuning voltages Vtune_I, Vtune_Q at Vlow and Vhigh respectively applied to the respective control terminals of the first and second capacitive devices C_I, C_Q. Therefore, initially the first and second oscillation circuits VCO-I, VCO_Q oscillate at unequal frequencies.

At step 250 and time t6, after the oscillation has commenced, the fifth and sixth switches S5, S6 are closed, thereby applying the frequency control signal F having voltage Vf to the first and second inputs 152, 154 of the filter 150. Consequently, the first and second tuning voltages Vtune_I, Vtune_Q change to become equal to the voltage Vf. This change is gradual due to the action of the first and second resistive elements R1, R2 and first and second capacitive elements C1, C2 in the filter 150. Therefore, the filter 150 smoothes the transition of the first and second tuning voltages from their respective unequal values to their equal values. At time t7 the first and second tuning voltages Vtune_I, Vtune_Q have become equal to the voltage Vf, and therefore the first and second oscillation circuits VCO_I, VCO_Q at this time are oscillating at the frequency indicated by the frequency control signal F. In this way, the controller 100 establishes the first and second tuning voltages Vtune_I, Vtune_Q at equal values after enabling oscillation of the first and second oscillation circuits VCO_I, VCO_Q. In general, but not necessarily, the voltage Vf may be different from both Vow and Vhigh, and typically, but not necessarily, the voltage Vf may be between Vlow and Vhigh. The time t7 may, for a 30 GHz frequency of oscillation, occur, for example, 10 ns after time t6.

The voltage Vf of the frequency control signal F is tunable over a voltage range, in order to select the frequency of the quadrature-related oscillation signals I, Q that are established at time t7. Preferably the difference between Vhigh and Vlow, which determines the initial, unequal frequencies of the first and second oscillation circuits VCO_I, VCO_Q at step 240 and time t5, is at least ten percent of this voltage range.

The description above of the flow chart of FIG. 5 and the timing diagram of FIG. 6 relate to the oscillation circuit 10 being started in a first stable oscillation mode, referred to herein as Mode 1, in which the second oscillation signal Q leads the first oscillation signal I by 90 degrees. Alternatively, to start the oscillation circuit 10 in a second stable oscillation mode, referred to herein as Mode 2, in which the first oscillation signal leads the second oscillation signal Q by 90 degrees, the steps of the flow chart of FIG. 5 and the timing diagram of FIG. 6 would be altered so that, at step 220 and time t2 the second and third switches S2, S3 are closed and the first and fourth switches S1, S4 remain open, and at step 230 and time t4 the second and third switches S2, S3 are opened and the first and fourth switches S1, S4 remain open. The table of FIG. 7 illustrates the states of the first, second, third and fourth switches S1, S2, S3, S4 during the time period t3 to t4, for Mode 1 and Mode 2. In this way, the controller 100 may select which of the first and second tuning voltages Vtune_I, Vtune_Q has the higher of the unequal values, corresponding to Vhigh and Vlow, and consequently select which of the first and second controllable frequencies is the higher.

Optionally, the time t1 at which the upper voltage rail 114 switches to voltage Vhigh may coincide with time t0 at which the enable signal Enb is switched from OFF to ON. Moreover, the time t2 at which, for Mode 1, the first and fourth switches S1, S4 are closed, or, for Mode 2, the second and third switches S2, S3 are closed, may coincide with time t1 at which the upper voltage rail 114 switches to voltage Vhigh. Furthermore, the time t4 at which, for Mode 1, the first and fourth switches S1, S4 are switched from closed to open, or, for Mode 2, the second and third switches S2, S3 are switched from closed to open, may coincide with time t3 at which the first and second tuning voltages Vtune-I, Vtune_Q, reach, respectively the voltages Vlow and Vhigh.

Time t5 at which oscillation commences is chosen to occur after the first and second tuning voltages Vtune-I, Vtune_Q, have reached, or substantially reached, respectively the voltages Vlow and Vhigh. A suitable value of the time difference between times t5 and t6 may be chosen by trial or simulation to ensure reliable start up of the oscillation circuit in the desired oscillation mode. In general, the time difference between times t6 and t5, is dependent on the filter 150 and also on the frequency of oscillation, and in general may be shorter for higher oscillation frequencies. For example, for a 30 GHz frequency of oscillation, time t6 may occur 1 ns after time t5.

As an alternative to the first and second oscillation control switches OS1, OS2 for enabling the first and second oscillation circuits VCO-I, VCO_Q to commence oscillating, one or more switches may be provided elsewhere in the oscillator circuit 10 for enabling the oscillation. For example, the voltage Vdd of the power supply rail 118 may be switched.

The filter 150 smoothes the transition of the first and second tuning voltages from their respective unequal values to their equal values by providing the frequency response of a low-pass. Alternatively, a different frequency response may be provided for smoothing the transition, for example a multiple-pole frequency response. Therefore, the filter 150 may be a single-pole low-pass filter, or may alternatively be a multiple-pole filter or another type of filter. As an alternative, or an additional, way of smoothing the transition of the first and second tuning voltages from their respective unequal values to their equal values, the frequency control signal F may be arranged to change in a smooth manner, for example, by being under the control of the processor 160 or another processor.

As described above with reference to FIG. 3, the first and second oscillation circuits VCO_I, VCO_Q generate the first and second oscillation signals I, Q having the first and second controllable frequencies by comprising, respectively, tunable first and second resonant circuits T_I, T_Q which may be tuned by respective first and second tuning voltages, or, more generally, first and second tuning signals, under the control of the controller 100. Therefore, in the embodiment described with reference to FIG. 3, the first and second oscillation circuits VCO_I, VCO_Q are voltage controlled oscillators (VCOs).

The options for the tunable resonant circuits described above with reference to FIG. 1 may be employed in variants of the embodiments described with reference to FIG. 3. Therefore, other embodiments of the first and second oscillation circuits VCO_I, VCO_Q may be used instead of those described above with reference to FIG. 3, and in particular other embodiments of the first and second resonant circuits T_I, T_Q may be used. For example, the first and second resonant circuits T_I, T_Q may each comprise one or more inductive devices that are tunable, having an inductance dependent on a tuning voltage. In other embodiments, the first and second resonant circuits T_I, T_Q may each comprise an inductive device comprising a switchable bank of inductive elements, or a capacitive device comprising a switchable bank of capacitive elements, which is switched under the control of the controller 100 to control the first and second controllable frequencies by means of a tuning signal that is, for example, a digital signal comprising a digital word. In this case, the first and second oscillation circuits VCO_I, VCO_Q may be digitally controlled oscillators (DCOs), rather than VCOs.

Referring to FIG. 8, a phase locked loop 300 comprises the oscillator circuit 10 that has the first and second controller inputs 102, 104 for receiving at the controller 100, respectively, the frequency control signal F and the enable signal Enb. An oscillation signal output 350 of the oscillator circuit 10 delivers from the first, second, fifth and sixth nodes N1, N2, N5, N6 respectively the quadrature related first and second oscillation signals I, Q, which comprise the positive and negative first signal components I_p and I_n and the positive and negative second signal components Q_p and Q_n. A feedback signal output 360 of the oscillator circuit 10 delivers a feedback signal that is a subset of the signals present at the oscillation signal output 350. For example, the feedback signal may be either the first oscillation signal I, in the form of the positive and negative first signal components I_p and I_n, or the second oscillation signal Q, in the form of the positive and negative second signal components Q_p and Q_n.

The feedback signal output 360 of the oscillator circuit 10 is coupled to a first divider input 314 of a frequency divider 310. The frequency divider 310 divides the feedback signal by a divisor N that is provided at a second divider input 312. An output 316 of the frequency divider 310 delivers the divided feedback signal and is coupled to a first input 322 of a phase detector (PD) 320. A reference oscillator 330 is coupled to a second input 324 of the phase detector 320 and delivers a reference signal. An output 326 of the phase detector 320 delivers an indication of the phase difference between the reference signal and the divided feedback signal, and is coupled to the first controller input 102 by means of a low pass loop filter 340, thereby delivering the frequency control signal F to the oscillator circuit 10.

Referring to FIG. 9, a wireless communication device 400 comprises a transceiver (Tx/Rx) 410 coupled to an antenna 420 for transmitting and receiving radio frequency (RF) signals, and coupled to a digital signal processor (DSP) 430 that processes baseband signals that are received or are to be transmitted at RF. The wireless communication device 400 also comprises the phase locked loop (PLL) 300 described above with reference to FIG. 8, and which therefore comprises the oscillator circuit 10. The DSP 430 is coupled to the second divider input 312 of the PLL 300 for delivering an indication of the divisor N, and the oscillation signal output 350 of the PLL 300 is coupled to the transceiver 410 for delivering the quadrature related first and second oscillation signals I, Q for use as local oscillator signals by the transceiver 410.

The ground GND may be at a potential of 0V. Optionally, a non-zero voltage may be employed instead.

Features that are described in the context of separate embodiments may be provided in combination in a single embodiment. Conversely, features that are described in the context of a single embodiment may also be provided separately or in any suitable sub-combination.

It should be noted that the term "comprising" does not exclude other elements or steps, the term "a" or "an" does not exclude a plurality, a single feature may fulfill the functions of several features recited in the claims and reference signs in the claims shall not be construed as limiting the scope of the claims. It should also be noted that where a component is described as being "configured to" or "arranged to" or "adapted to" perform a particular function, it may be appropriate to consider the component as merely suitable "for" performing the function, depending on the context in which the component is being considered. Throughout the text, these terms are generally considered as interchangeable, unless the particular context dictates otherwise. It should also be noted that the Figures are not necessarily to scale, emphasis instead generally being placed upon illustrating the principles of the present invention.

The invention claimed is:

1. An oscillator circuit for generating quadrature-related first and second oscillation signals having equal frequencies, the oscillator circuit comprising:
   a first oscillation circuit configured to generate the first oscillation signal having a first controllable frequency;
   a second oscillation circuit configured to generate the second oscillation signal having a second controllable frequency; and
   control circuitry configured to:
      enable and disable oscillation of the first and second oscillation circuits; and
      control the first and second controllable frequencies such that, when the oscillation is enabled, the first and second controllable frequencies are controlled to be initially unequal by a selected amount and then to become equal.

2. The oscillator circuit of claim 1, wherein the control circuitry is configured to select which of the first and second controllable frequencies has a higher of the unequal frequencies.

3. The oscillator circuit of claim 1, wherein the selected amount comprises at least one percent of a lower of the unequal frequencies.

4. The oscillator circuit of claim 3, wherein the selected amount comprises at least five percent of the lower of the unequal frequencies.

5. The oscillator circuit of claim 1, wherein the control circuitry is configured to smooth transition of the first and second controllable frequencies from their respective unequal frequencies to their equal frequencies.

6. The oscillator circuit of claim 1, wherein:
   the first oscillation circuit comprises a first resonant circuit having a first resonant frequency dependent on a first tuning signal;
   the second oscillation circuit comprises a second resonant circuit having a second resonant frequency dependent on a second tuning signal; and
   the control circuitry is configured to control the first and second controllable frequencies to be initially unequal by the selected amount by establishing the first and second tuning signals at selected unequal values prior to enabling oscillation of the first and second oscillation circuits.

7. The oscillator circuit of claim 6:
   wherein the first resonant circuit comprises a first capacitive device having a capacitance dependent on the first tuning signal; and wherein the second resonant circuit comprises a second capacitive device having a capacitance dependent on the second tuning signal.

8. The oscillator circuit of claim 6, wherein the first and second capacitive devices each comprise a varactor.

9. The oscillator circuit of claim 6, wherein the first and second tuning signals are variable over a voltage range, and the selected amount comprises at least ten percent of the voltage range.

10. The oscillator circuit of claim 6, wherein the control circuitry comprises a filter configured to smooth transition of the first and second tuning signals from their respective unequal values to subsequent equal values for establishing the equal frequencies.

11. A phase locked loop, comprising:
an oscillator circuit for generating quadrature-related first and second oscillation signals having equal frequencies, the oscillator circuit comprising:
  a first oscillation circuit configured to generate the first oscillation signal having a first controllable frequency;
  a second oscillation circuit configured to generate the second oscillation signal having a second controllable frequency; and
  control circuitry configured to:
    enable and disable oscillation of the first and second oscillation circuits; and
    control the first and second controllable frequencies such that, when the oscillation is enabled, the first and second controllable frequencies are controlled to be initially unequal by a selected amount and then to become equal.

12. A wireless communication device, comprising:
an oscillator circuit for generating quadrature-related first and second oscillation signals having equal frequencies, the oscillator circuit comprising:
a first oscillation circuit configured to generate the first oscillation signal having a first controllable frequency;
  a second oscillation circuit configured to generate the second oscillation signal having a second controllable frequency; and
  control circuitry configured to:
    enable and disable oscillation of the first and second oscillation circuits; and
    control the first and second controllable frequencies such that, when the oscillation is enabled, the first and second controllable frequencies are controlled to be initially unequal by a selected amount and then to become equal.

13. A method of operating an oscillator circuit to generate quadrature-related first and second signals having equal frequencies, the oscillator circuit comprising: 1) a first oscillation circuit configured to generate the first oscillation signal having a first controllable frequency; and 2) a second oscillation circuit configured to generate the second oscillation signal having a second controllable frequency; the method comprising:
  enabling oscillation of the first and second oscillation circuits; and
  controlling the first and second controllable frequencies to be initially unequal by a selected amount and then to become equal.

14. The method of claim 13, further comprising selecting which of the first and second controllable frequencies has a higher of the unequal frequencies.

15. The method of claim 13, wherein the selected amount comprises at least one percent of the lower of the unequal frequencies.

16. The method of claim 15, wherein the selected amount comprises at least five percent of the lower of the unequal frequencies.

17. The method of claim 13, further comprising smoothing the transition of the first and second controllable frequencies from their respective unequal frequencies to their equal frequencies.

* * * * *

UNITED STATES PATENT AND TRADEMARK OFFICE
CERTIFICATE OF CORRECTION

PATENT NO. : 10,826,432 B2
APPLICATION NO. : 16/473287
DATED : November 3, 2020
INVENTOR(S) : Oredsson et al.

Page 1 of 1

It is certified that error appears in the above-identified patent and that said Letters Patent is hereby corrected as shown below:

In the Claims

In Column 13, Line 4, in Claim 8, delete "The oscillator circuit of claim 6," and insert -- The oscillator circuit of claim 7, --, therefor.

In Column 13, Line 6, in Claim 9, delete "The oscillator circuit of claim 6," and insert -- The oscillator circuit of claim 8, --, therefor.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*